(12) United States Patent
Lo et al.

(10) Patent No.: US 11,978,640 B2
(45) Date of Patent: May 7, 2024

(54) METHOD OF MANUFACTURING SEMICONDUCTOR DEVICES

(71) Applicant: TAIWAN SEMICONDUCTOR MANUFACTURING CO., LTD., Hsinchu (TW)

(72) Inventors: Yi-Chen Lo, Zhubei (TW); Yi-Shan Chen, Tainan (TW); Chih-Kai Yang, Taipei (TW); Pinyen Lin, Rochester, NY (US)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 186 days.

(21) Appl. No.: 17/226,332

(22) Filed: Apr. 9, 2021

(65) Prior Publication Data

US 2022/0328324 A1    Oct. 13, 2022

(51) Int. Cl.
*H01L 21/311* (2006.01)
*H01L 21/033* (2006.01)
*H01L 21/66* (2006.01)

(52) U.S. Cl.
CPC .... *H01L 21/31144* (2013.01); *H01L 21/0337* (2013.01); *H01L 22/12* (2013.01)

(58) Field of Classification Search
CPC .......... H01L 21/3065–30655; H01L 21/31116; H01L 21/31122; H01L 21/31138; H01L 21/67069; H01L 21/32136–32137; H01L 21/02071; H01L 21/31144; H01L 21/0337; H01L 22/12; H01J 2237/334–3348
See application file for complete search history.

(56) References Cited

U.S. PATENT DOCUMENTS

| | | | |
|---|---|---|---|
| 8,101,510 B2 | 1/2012 | Godet et al. | |
| 2015/0311073 A1* | 10/2015 | Srinivasan | H01L 29/78 438/504 |
| 2017/0263460 A1* | 9/2017 | Ruffell | H01L 21/31144 |
| 2019/0146357 A1* | 5/2019 | Wang | G03F 7/705 430/22 |

OTHER PUBLICATIONS

Krishnan, S., Kwark, Y.-J. and Ober, C.K. (2004), Fluorinated polymers: liquid crystalline properties and applications in lithography. Chem Record, 4: 315-330. https://doi.org/10.1002/tcr.20022 (Year: 2004).*

Semiconductor Lithography https://web.archive.org/web/20200926221534/https://www.newport.com/n/photolithography-overview (Year: 2020).*

* cited by examiner

*Primary Examiner* — Charles D Garber
*Assistant Examiner* — Cole Leon Lindsey
(74) *Attorney, Agent, or Firm* — STUDEBAKER & BRACKETT PC

(57) ABSTRACT

In a method of forming a pattern over a semiconductor substrate, a target layer to be patterned is formed over a substrate, a mask pattern including an opening is formed in a mask layer, a shifting film is formed in an inner sidewall of the opening, a one-directional etching operation is performed to remove a part of the shifting film and a part of the mask layer to form a shifted opening, and the target layer is patterned by using the mask layer with the shifted opening as an etching mask. A location of the shifted opening is laterally shifted from an original location of the opening.

20 Claims, 13 Drawing Sheets

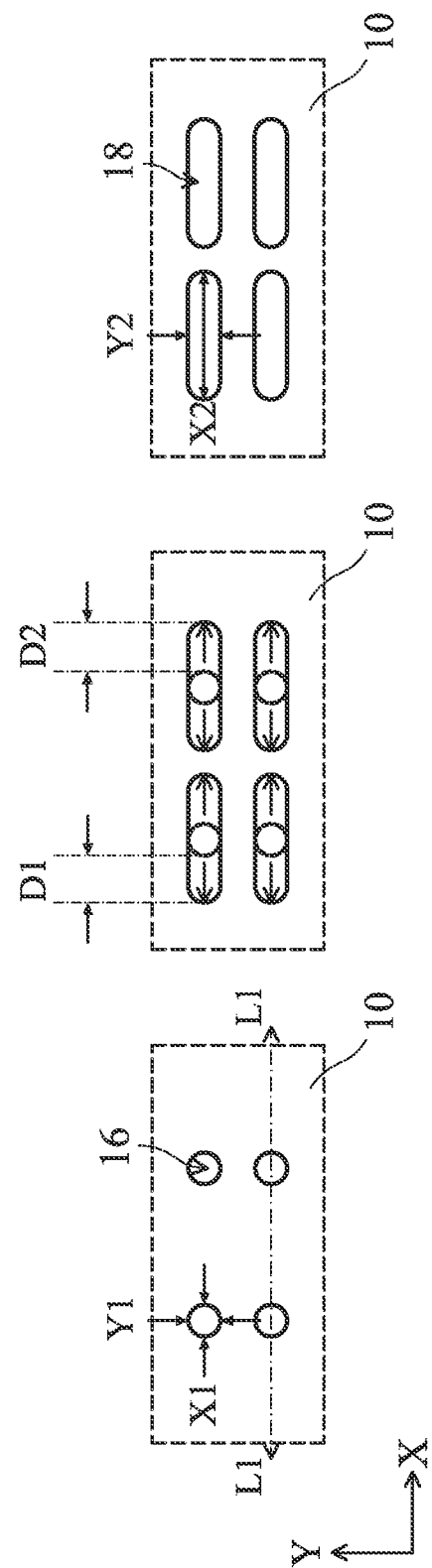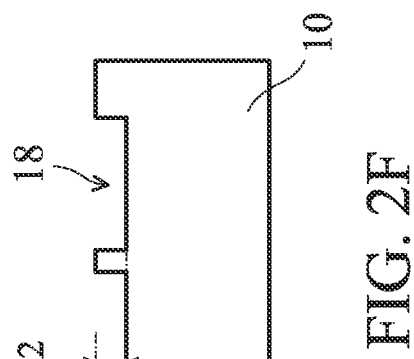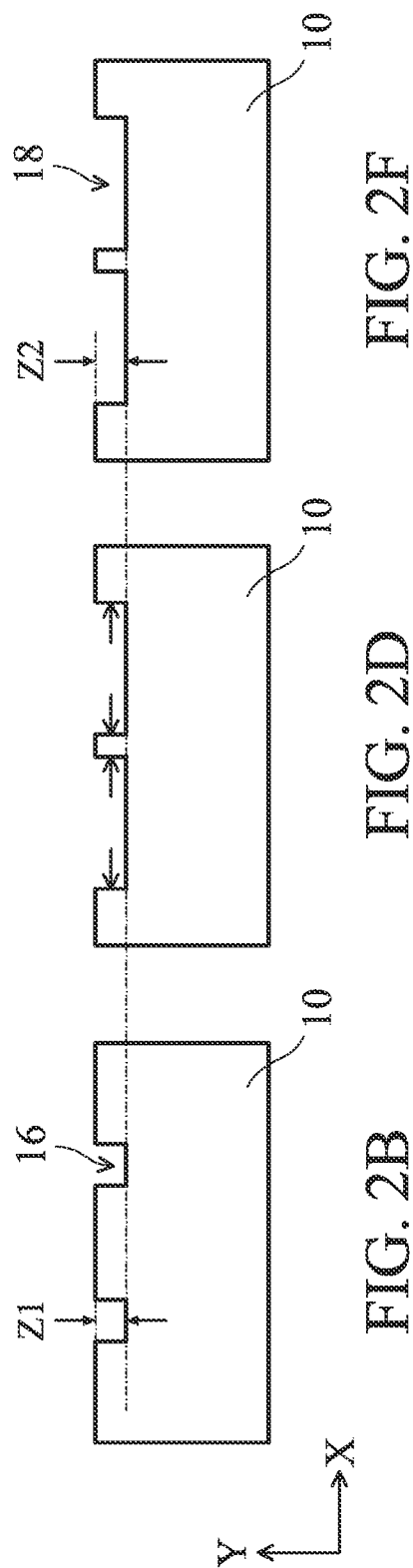

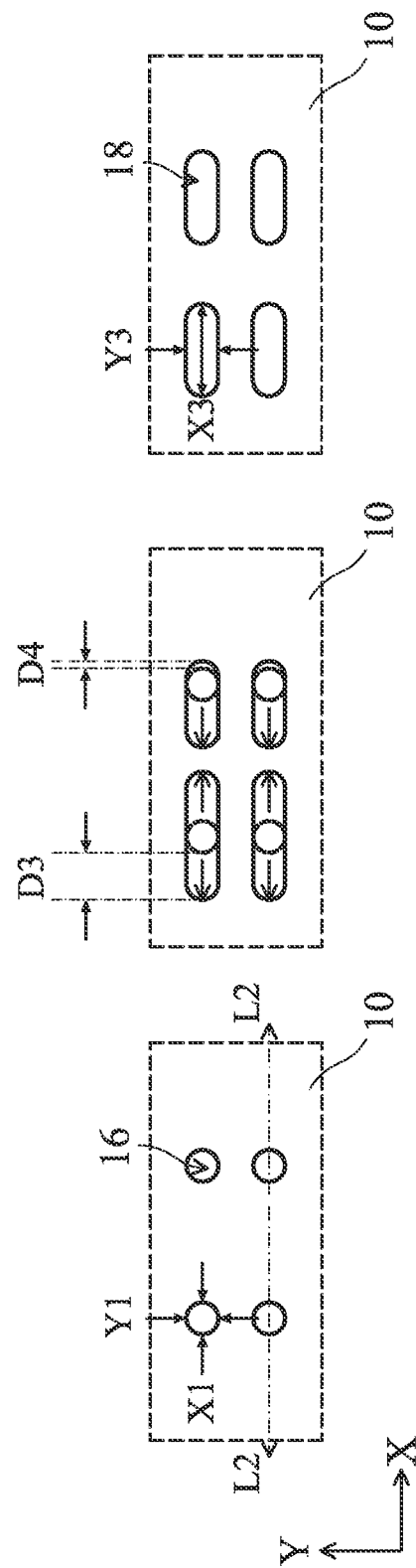

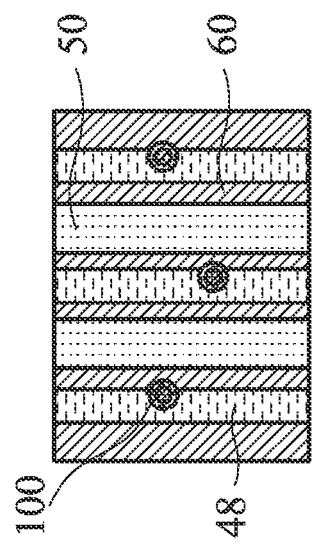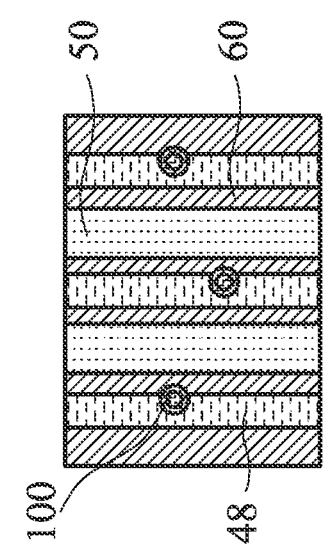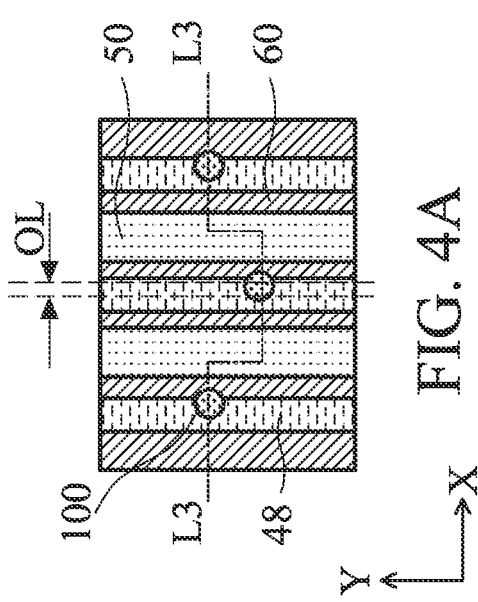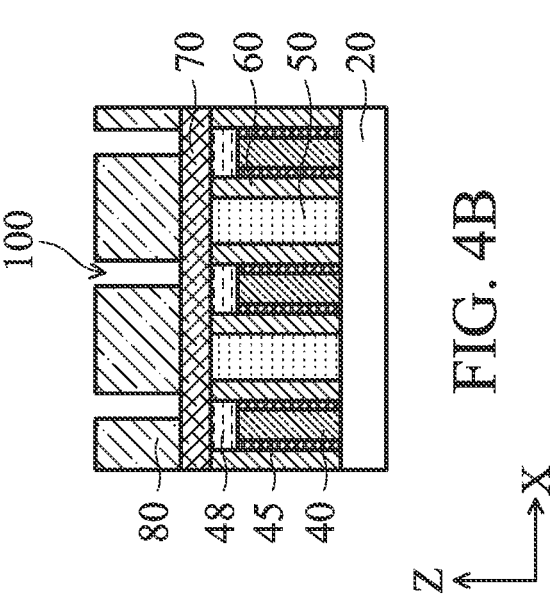

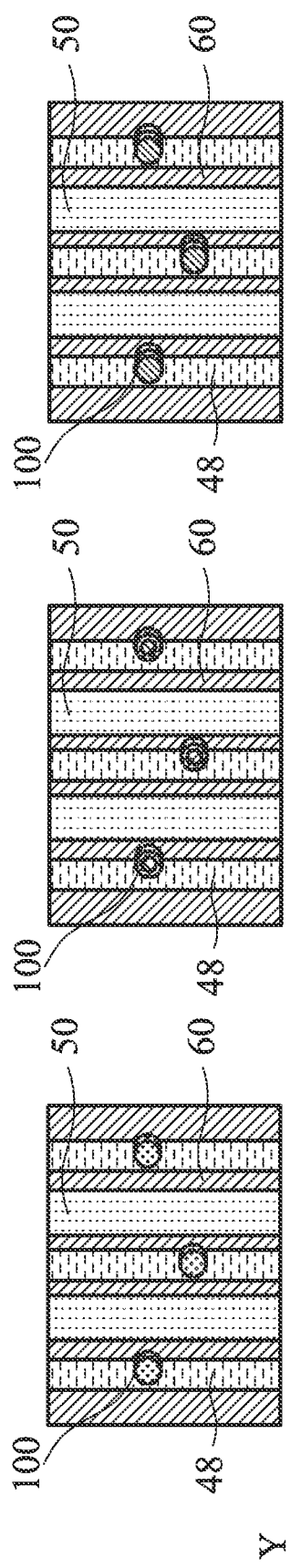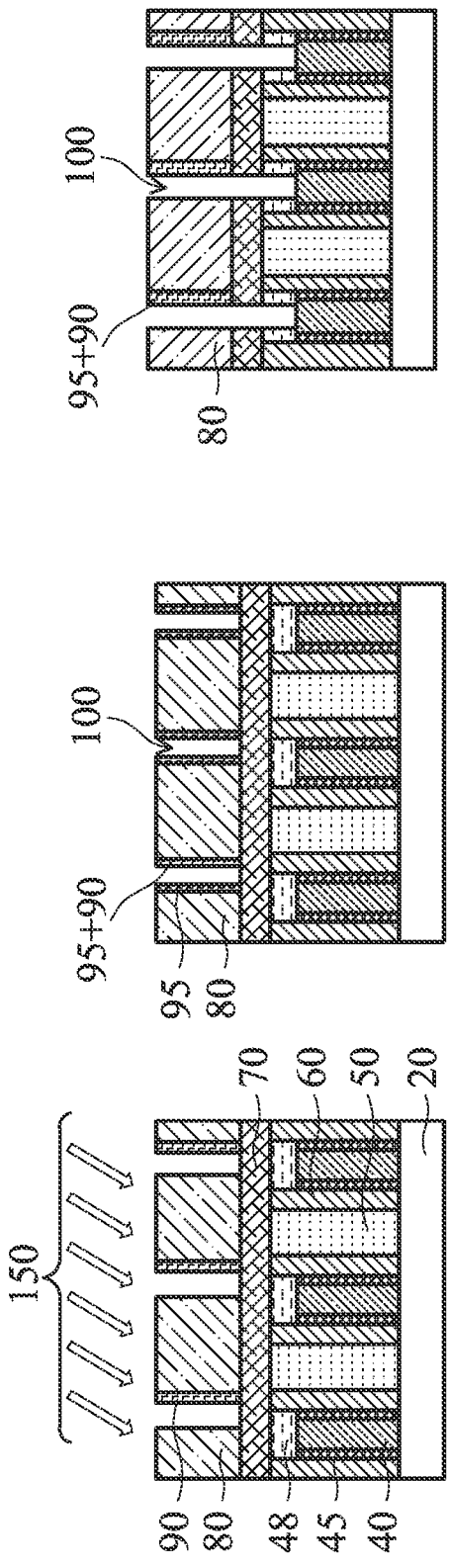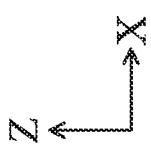

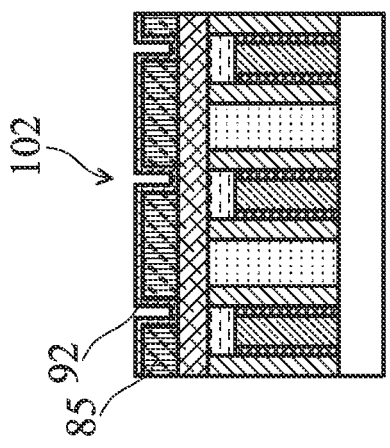
FIG. 14A
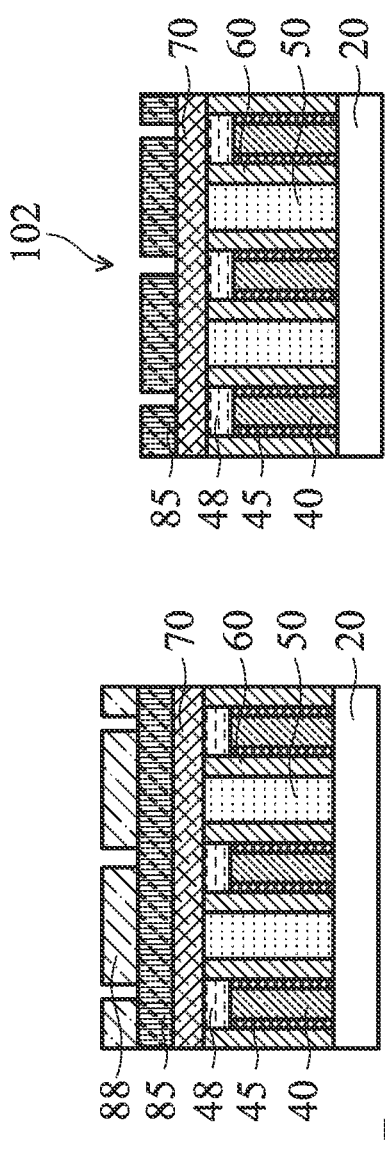
FIG. 14B
FIG. 14C
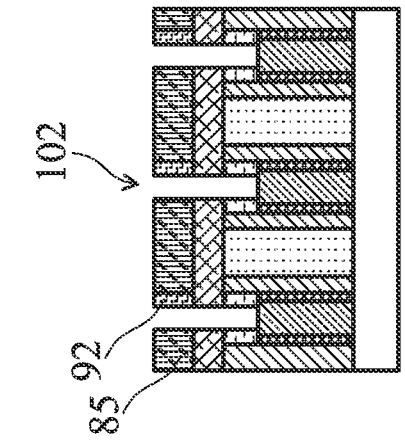
FIG. 14D
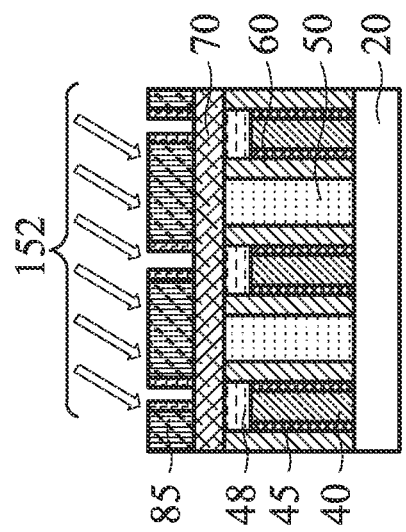
FIG. 14E
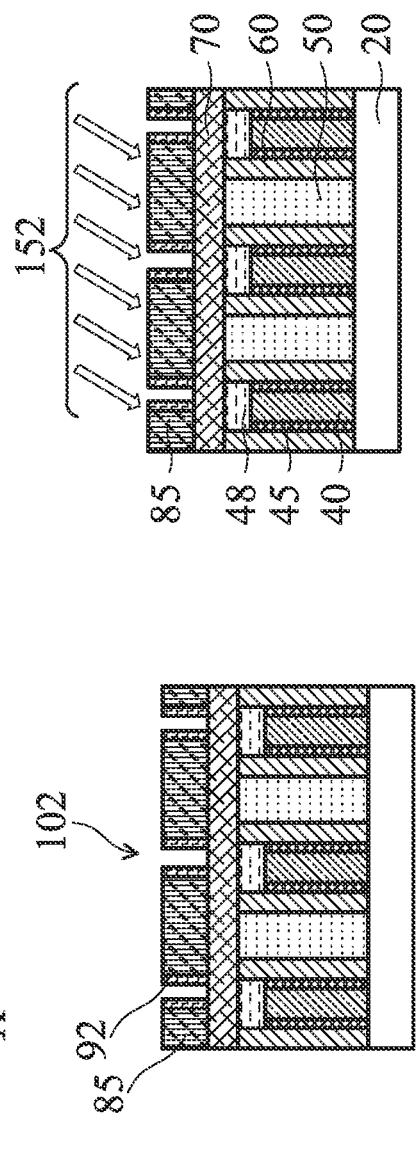
FIG. 14F

METHOD OF MANUFACTURING SEMICONDUCTOR DEVICES

BACKGROUND

At semiconductor technology nodes of 7 nm or smaller, line-and-space (L/S) patterning requires pitch resolution in optical lithography smaller than about 32 nm. In general, even if extreme ultra violet (EUV) lithography is employed, the resolution limitation by EUV single-exposure technology (SPT) is about 28 nm to about 34 nm. To obtain smaller pitch patterns, a double-patterning technology (DPT) with twice repeating lithography exposure processes will be needed for patterning of a L/S pitch smaller than about 32 nm. However, the cost of EUV with the DPT approach would be too expensive for a mass-production application. In addition, overlay error tolerance becomes smaller as the pitch or CD (critical dimension) of the pattern become smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a plan view of one of the various stages of a patterning operation in accordance with an embodiment of the present disclosure. FIG. 2B illustrates a cross sectional view corresponding to line L1-L1 of FIG. 2A.

FIG. 2C illustrates a plan view of one of the various stages of a patterning operation in accordance with an embodiment of the present disclosure. FIG. 2D illustrates a cross sectional view corresponding to line L1-L1 of FIG. 2A.

FIG. 2E illustrates a plan view of one of the various stages of manufacturing operations in accordance with an embodiment of the present disclosure. FIG. 2F illustrates a cross sectional view corresponding to line L1-L1 of FIG. 2A.

FIG. 3A illustrates a plan view of one of the various stages of a patterning operation in accordance with an embodiment of the present disclosure. FIG. 3B illustrates a cross sectional view corresponding to line L2-L2 of FIG. 3A.

FIG. 3C illustrates a plan view of one of the various stages of a patterning operation in accordance with an embodiment of the present disclosure. FIG. 3D illustrates a cross sectional view corresponding to line L2-L2 of FIG. 3A.

FIG. 3E illustrates a plan view of one of the various stages of manufacturing operations in accordance with an embodiment of the present disclosure. FIG. 3F illustrates a cross sectional view corresponding to line L2-L2 of FIG. 3A.

FIG. 4A illustrates a plan view and FIG. 4B illustrates a cross sectional view of one of the various stages of a sequential manufacturing operation of a semiconductor device in accordance with an embodiment of the present disclosure.

FIG. 5A illustrates a plan view and FIG. 5B illustrates a cross sectional view of one of the various stages of a sequential manufacturing operation of a semiconductor device in accordance with an embodiment of the present disclosure.

FIG. 6A illustrates a plan view and FIG. 6B illustrates a cross sectional view of one of the various stages of a sequential manufacturing operation of a semiconductor device in accordance with an embodiment of the present disclosure.

FIG. 7A illustrates a plan view and FIG. 7B illustrates a cross sectional view of one of the various stages of a sequential manufacturing operation of a semiconductor device in accordance with an embodiment of the present disclosure.

FIG. 8A illustrates a plan view and FIG. 8B illustrates a cross sectional view of one of the various stages of a sequential manufacturing operation of a semiconductor device in accordance with an embodiment of the present disclosure.

FIG. 9A illustrates a plan view and FIG. 9B illustrates a cross sectional view of one of the various stages of a sequential manufacturing operation of a semiconductor device in accordance with an embodiment of the present disclosure.

FIGS. 14A, 14B, 14C, 14D, 14E and 14F illustrate cross sectional views of the various stages of manufacturing operations in accordance with an embodiment of the present disclosure.

DETAILED DESCRIPTION

Figure 1A:
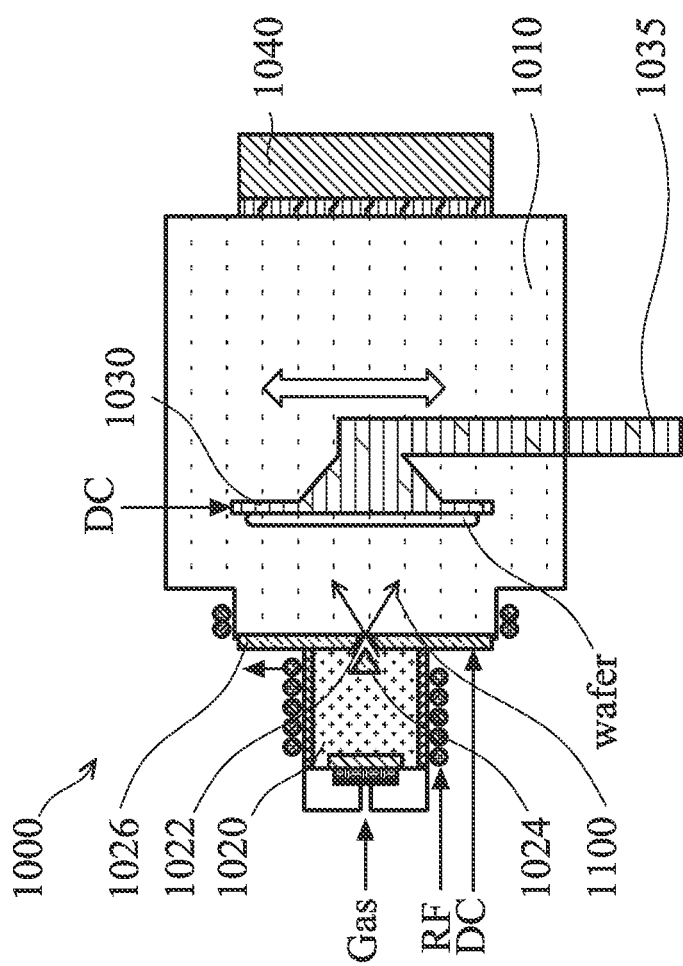
FIG. 1A shows a schematic view of a directional patterning apparatus in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure.

In the present disclosure, a directional patterning technique to compensate or correct an overlay error will be explained.

A directional patterning technique includes a directional etching technique and a directional deposition technique. The directional etching can be characterized as horizontal or surface anisotropic or selective etching, in which a target layer or pattern is etched substantially only one direction (e.g., X direction) within a plane (X-Y plane) parallel to a substrate, substantially without etching another direction (e.g., Y direction).

A directional etching can be performed by tuning various etching parameters to generate etching species (free radicals) that travel in a substantially horizontal direction or that are incident on the substrate with a large incident angle of more than about 10-30 degrees (where the angle of 90 degrees is horizontal). The etching parameters to be tuned include, but are not limited to, etchant (gas) composition, etching temperature, etching time, etching pressure, radio frequency (RF) bias voltage, RF bias power, etchant flow rate, wafer tilting, other suitable etching parameters, or combinations thereof.

Figure 1B:
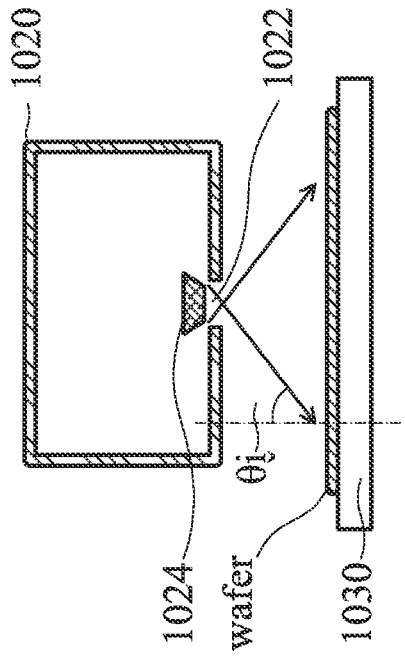
FIGS. 1B, 1C, 1D and 1E show schematic views of directional patterning in accordance with an embodiment of the present disclosure.
Figure 1D:
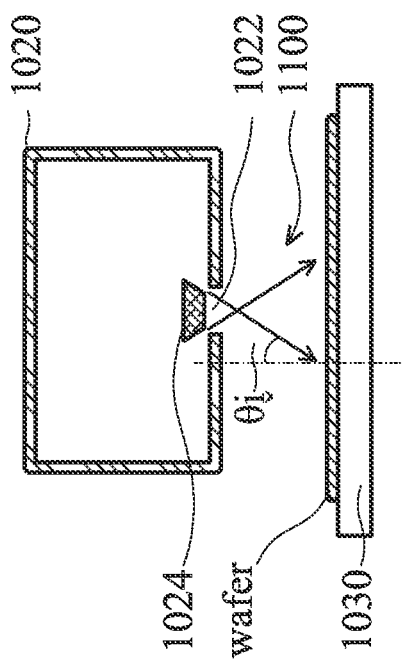
Figure 1C:
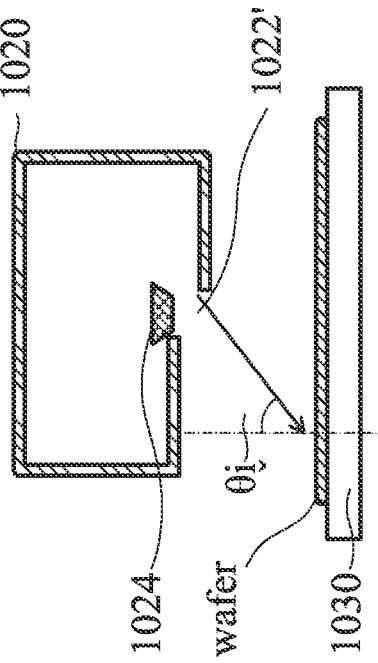

FIG. 1A shows a schematic view of a directional patterning apparatus, and FIGS. 1B, 1C and 1D show schematic views of directional patterning in accordance with an embodiment of the present disclosure.

As shown in FIG. 1A, the directional patterning apparatus, for example, a directional etching apparatus 1000 includes a main chamber 1010 in which a wafer stage 1030 for a wafer to be processed is disposed, and a plasma generation chamber 1020 for generating plasma. In some embodiments, the plasma is RF (radio frequency) generated plasma, using a high frequency power supply at 13.56 MHz and/or 2.45 GHz. Other frequency ranges may be used. A separation plate 1026 is disposed between the main chamber 1010 and the plasma chamber 1020. The separation plate 1026 includes a slit 1022 from which plasma beams 1100 are introduced into the main chamber. In some embodiments, an adjustable meniscus 1024 is provided over the slit 1022 in the plasma chamber side. One or more vacuum systems 1040 including, for example, a turbo molecular pump, is coupled to the main chamber and to the plasma chamber (not shown) to maintain reduced pressure states in the chambers. In some embodiments, during the etching process, the pressure in the main chamber is lower than the pressure in the plasma chamber. In certain embodiments, the pressure in the main chamber is in the order of $1 \times 10^{-5}$ Torr, and the pressure in the plasma chamber is in the order of $1 \times 10^{-3}$ Torr.

In some embodiments, the separation plate 1026 and the wafer stage 1030 are biased by DC voltage, respectively, to extract and control the plasma beams 1100. Further, the wafer stage 1030 is movable by a moving mechanism 1035 to scan the wafer relative to the plasma beams 1100.

In some embodiments, at least one of RF and DC bias voltages is tuned to achieve an electric field that causes etching species to flow substantially horizontally along an in-plane direction (for example, in the X direction) relative to a surface over the substrate, or to provide a large incident angle. In some embodiments, the etching species are tuned to have a profile of momenta of the energetic species such that the momenta of the etching species or energetic species along a frontline are not the same, i.e., the momentum of an etching or energetic species on the top path is different from the momentum of an etching or energetic species on the bottom path. In some embodiments, the momentum of an etching or energetic species on the top path is different from the momentum of an etching or energetic species in the middle path above the bottom path, and the momentum of the etching or energetic species on the top path is the same as or different from the momentum of an etching or energetic species on the bottom path. Any combinations can be achieved by adjustment of the electromagnetic control to tune the energies of the etching or energetic species alone the etching front.

In some embodiments, as shown in FIGS. 1B and 1C, a position of the meniscus 1024 is adjusted to change the incident angle θi of the plasma beams 1100. As shown in FIG. 1D, by scanning the wafer along the X direction, a groove pattern can be formed without substantially expanding the groove in the Y direction.

In some embodiments, a ratio of an amount of etching in the X direction to an amount of etching in the Y direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments. Further, an amount of etching along the Z direction (vertical direction) is smaller than the amount of etching in the X direction. In some embodiments, a ratio of an amount of etching in the X direction to an amount of etching in the Z direction is about 2 or more, and is about 5 or more in other embodiments. In certain embodiments, the ratio is about 10 or more. Ideally, the ratio is as high as possible, but it can be up to about 100 in some embodiments and up to about 50 in other embodiments.

Figure 1E:
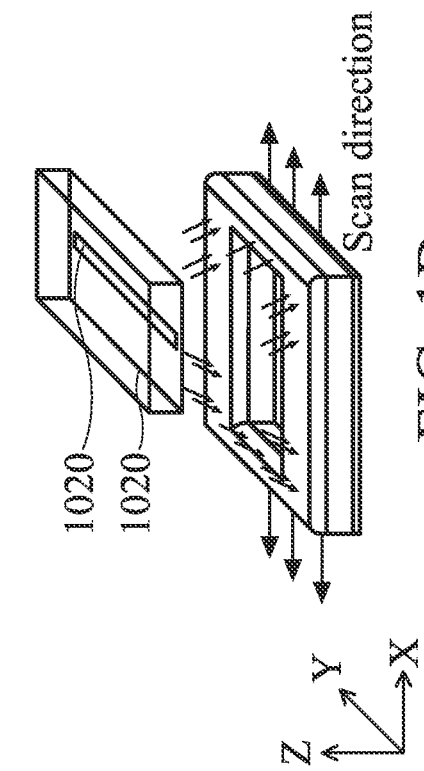

In the embodiments of FIGS. 1B-1D, the directional etching process is bi-directional (+X and −X). In some embodiments, as shown in FIG. 1E, the directional etching process is one-directional (−X), by using a modified slit 1022'.

FIGS. 2A-2F show plan views and cross sectional views of various stages for manufacturing a semiconductor device in accordance with another embodiment of the present disclosure. It is understood that additional operations can be provided before, during, and after processes shown by FIGS. 2A-2F, and some of the operations described below can be replaced or eliminated, for additional embodiments of the method. The order of the operations/processes may be interchangeable. FIGS. 2A, 2C and 2E are plan views (viewed from the above) and FIGS. 2B, 2D and 2E are cross sectional views corresponding to line L1-L1 of FIG. 2A.

In some embodiment, hole patterns 16 are formed in the surface portion of the target layer 10, by using one or more lithography and etching operations. The hole pattern 16 has a diameter X1 or Y1 and a depth Z1, as shown in FIGS. 2A and 2B. The target layer 10 is one or more layers of a conductive material and/or a dielectric material. In some embodiments, the target layer 10 includes a dielectric material, such as silicon oxide, silicon nitride, SiON, SiOC, SiOCN, SiCN, aluminum based dielectric material, low-k material, organic material, or any other dielectric material used in a semiconductor device fabrication. In some embodiment, the target layer 10 is formed over a substrate.

Next, as shown in FIGS. 2C and 2D, one or more directional etching operations (bi-directional) are performed to selectively etch the left edges and the right edges of the holes 16. By the directional etching in the X direction, the left and right edges of the holes 16 are etched by an amount D1 and D2, respectively. In the directional etching, the bottoms of the holes 16, the sides at the Y direction are also slightly etched in some embodiments. In some embodiments, D1 is equal to D2 and in other embodiments, D1 is different from D2.

The trench 18 has a length X2, a width Y2 and a depth Z2, as shown in FIGS. 2E and 2F. The length X2 is equal to X1+D1+D2. The difference Dy between widths Y2 and Y1 is equal to or greater than zero and smaller than (D1+D2)/2. In some embodiments, (D1+D2)/2 is two times or more, five times or more, or ten times or more Dy. In some embodiments, Z2 is greater than Z1 and ½ or less, ⅕ or less or ⅒ or less (D1+D2)/2.

FIGS. 3A-3F shows plan views and cross sectional views of various stages for manufacturing a semiconductor device in accordance with another embodiment of the present disclosure. It is understood that additional operations can be provided before, during, and after processes shown by FIGS. 3A-3F, and some of the operations described below can be replaced or eliminated, for additional embodiments of the method. The order of the operations/processes may be interchangeable. FIGS. 3A, 3C and 3E are plan views (viewed from the above) and FIGS. 3B, 3D and 3F are cross sectional views corresponding to line L2-L2 of FIG. 3A. Materials, configurations, dimensions, structures, conditions and operations the same as or similar to those explained with respect to FIGS. 2A-2F may be employed in the following embodiments, and some of the explanations may be omitted.

FIGS. 3A and 3B are identical to FIGS. 2A and 2B. As shown in FIGS. 3C and 3D, one or more directional etching operations (one-directional) are performed to selectively etch the left edges of the holes 16. By the directional etching in the −X direction, the left edges of the holes 16 are etched by an amount D3. In some embodiments, the right edges of the hole patterns 16 are also slightly etched in an amount of D4 as shown in FIG. 3C. In some embodiments, D4 is 0 or more and equal to or less than 10% of D3. In the directional etching, the bottoms of the holes 16, and the sides at the Y direction are also slightly etched in some embodiments.

The trench 18 has a length X3, a width Y3 and a depth Z3, as shown in FIGS. 3E and 3F. The length X3 is equal to X1+D3+D4. The difference Dy between widths Y3 and Y1 is equal to or greater than zero and smaller than (D3+D4)/2. In some embodiments, (D3+D4)/2 is two times or more, five times or more, or ten times or more Dy. In some embodiments, Z3 is greater than Z1 and ½ or less, ⅕ or less or ⅒ or less (D3+D4)/2.

In some embodiments, the bi-directional etching operation or the one-directional etching operation is applied to a photo resist pattern having hole patterns.

Figure 10A:
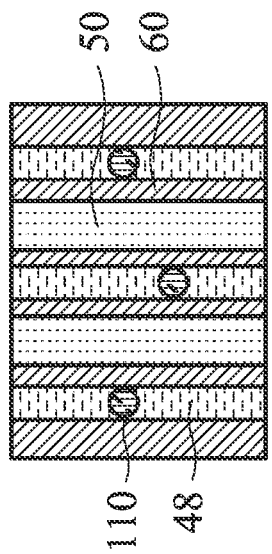
FIG. 10A illustrates a plan view and FIG. 10B illustrates a cross sectional view of one of the various stages of a sequential manufacturing operation of a semiconductor device in accordance with an embodiment of the present disclosure.
Figure 11A:
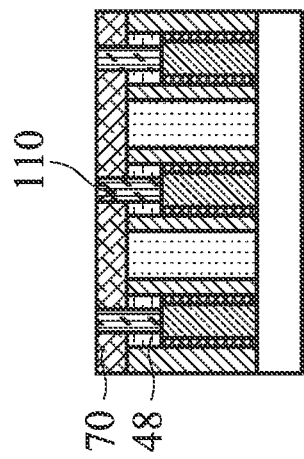
FIG. 11A illustrates a plan view and FIG. 11B illustrates a cross sectional view of one of the various stages of a sequential manufacturing operation of a semiconductor device in accordance with an embodiment of the present disclosure.
Figure 10B:
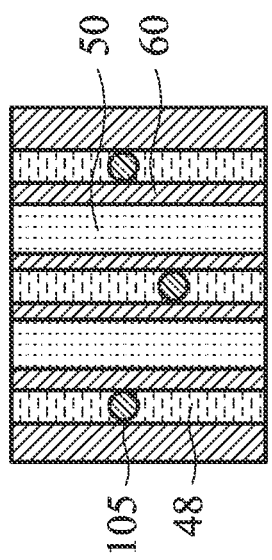
Figure 11B:
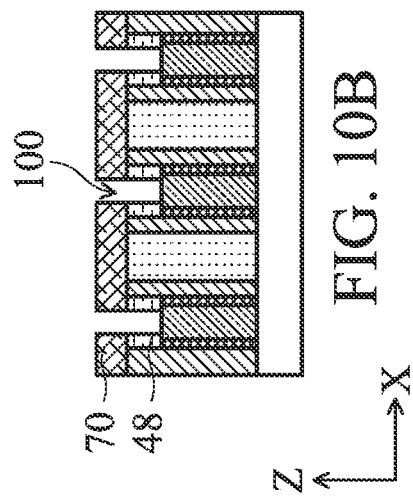
Figure 12:
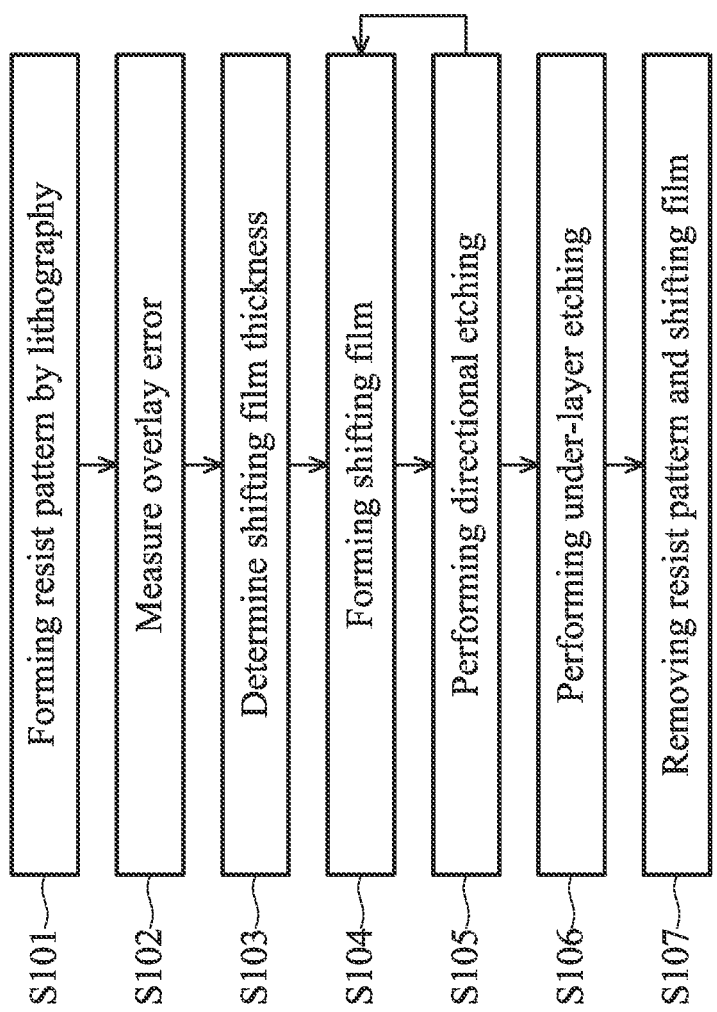
FIG. 12 shows a flow chart of a sequential manufacturing operation of a semiconductor device in accordance with an embodiment of the present disclosure.

FIGS. 4A-11B shows plan views and cross sectional views of various stages and FIG. 12 shows a flow chart of a sequential manufacturing operation of a semiconductor device in accordance with another embodiment of the present disclosure. It is understood that additional operations can be provided before, during, and after processes shown by FIGS. 4A-11B and FIG. 12, and some of the operations described below can be replaced or eliminated, for additional embodiments of the method. The order of the operations/processes may be interchangeable. In FIGS. 4A-11B, the "A" figures are plan or projected views (viewed from above) and the "B" figures are cross sectional views corresponding to line L3-L3 of FIG. 4A. Materials, configurations, dimensions, structures, conditions and operations the same as or similar to those explained with respect to FIGS. 2A-3F may be employed in the following embodiments, and some of the explanations may be omitted. In the plan or projected views (the "A" figures), some of the upper layers are omitted (or depicted as transparent layers) for simplicity.

In some embodiments, FIGS. 4A-11B show a sequential process for forming a contact hole to a gate electrode. In some embodiments, one or more gate electrodes 40 are formed over a channel region 20. In some embodiments, the semiconductor device is a planar FET and the channel region 20 is a part of a substrate, and in other embodiments, the semiconductor device of a FinFET and the channel region 20 is a part of a fin structure protruding from a substrate.

In some embodiments, the substrate (channel region) is of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate may include an epitaxial layer (epi-layer), which may be strained for performance enhancement, and/or may include a silicon-on-insulator (SOI) structure. In one embodiment, a p-type silicon substrate is used.

In some embodiments, the gate electrode 40 is a metal gate electrode formed over one or more dielectric layers, which are formed on the channel region 20. In some embodiments, the one or more dielectric layers include an interfacial layer formed on the channel region 20 and a gate dielectric layer formed on the interfacial layer. In some embodiments, the interfacial layer is formed by using chemical oxidation. In some embodiments, the interfacial layer includes one of silicon oxide, silicon nitride and silicon-germanium oxide. In some embodiments, the gate dielectric layer includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof.

In some embodiments, the gate electrode 40 includes one or more conductive layers. In some embodiments, one or more work function adjustment layers is formed over a barrier layer (e.g., TaN, Ta, TiN or Ti) formed on the gate dielectric layer, and a main metal layer is formed over the work function adjustment layer. The work function adjustment layer is made of a conductive material such as a single layer of TiN, TaN, TaAlC, TiC, TaC, Co, Al, TiAl, TiSi, TaSi or TiAlC, or a multilayer of two or more of these materials. For the n-channel FinFET, one or more of TaN, TaAlC, TiN, TiC, Co, TiAl, HfTi, TiSi and TaSi is used as the work function adjustment layer, and for the p-channel FinFET, one or more of TiAlC, Al, TiAl, TaN, TaAlC, TiN, TiC and Co is used as the work function adjustment layer. In some embodiments, the main metal layer includes a metallic material selected from the group consisting of W, Cu, Ti, Ag, Al, TiAl, TiAlN, TaC, TaCN, TaSiN, Mn, Co, Pd, Ni, Re, Tr, Ru, Pt, and Zr. In some embodiments, the main metal layer includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used.

Further as shown in FIG. 4B, gate sidewall spacers 45 are formed on opposing side faces of the gate electrode 40. The gate sidewall spacers 45 include one or more layers of dielectric material, such as, silicon oxide, silicon nitride, SiON, SiOC, SiOCN, SiCN, aluminum based dielectric material, low-k material, organic material, or any other dielectric material used in a semiconductor device fabrication. In addition, a gate cap dielectric layer 48 is formed over the gate electrode 40 as shown in FIG. 4B. In some embodiments, the gate cap dielectric layer 48 includes one or more layers of dielectric material, such as, silicon oxide, silicon nitride, SiON, SiOC, SiOCN, SiCN, aluminum based dielectric material, low-k material, organic material, or any other dielectric material used in a semiconductor device fabrication. In some embodiments, the gate cap dielectric layer 48 is formed over the gate sidewall spacers 45 as shown in FIG. 4B, and in other embodiments, the gate sidewall spacers 45 are also formed on opposing side faces of the gate cap dielectric layer 48.

Further, source/drain structures 50 including one or more epitaxial layers and/or a source/drain contact layer 50 is disposed over the source/drain region of the semiconductor layer (e.g., fin structure) 20. The materials used for the source/drain epitaxial layer may be varied for the n-type and p-type FinFETs. For example, SiP, SiCP or SiC may be used to form n-type FinFETs, and SiGe or Ge may be used to form p-type FinFETs. In some embodiments, boron (B) is doped in the source/drain epitaxial layer for the p-type FinFETs. Other materials can be used. In some embodiments, the source/drain epitaxial layer includes two or more epitaxial layers with different compositions and/or different dopant concentrations. In some embodiments, the source/drain contact layer is formed on the source/drain epitaxial layer and is made of one or more layers of W, Ni, Co, Mo, Ti, or alloy thereof.

As shown in FIGS. 4A and 4B, a first interlayer dielectric (ILD) layer 60 is formed between the gate structures and the source/drain structures. The first ILD layer includes compounds comprising Si, O, C and/or H, such as silicon oxide, SiCOH and SiOC. Organic materials, such as polymers, may be used for the first ILD layer.

Further, as shown in FIG. 4B, a second ILD layer 70 is formed over the first ILD layer 60. In some embodiments, the second ILD layer 70 includes compounds comprising Si, O, C and/or H, such as silicon oxide, SiCOH and SiOC. Organic materials, such as polymers, may be used for the second ILD layer 70. In some embodiments, before forming the second ILD layer 70, an etch stop layer (ESL) is formed over the first ILD layer 60, the gate cap dielectric layer 48 and the source/drain structure 50. The ESL is made of silicon nitride or a silicon nitride-based material (e.g., SiON, SiCN or SiOCN).

As shown in FIGS. 4A and 4B, a photo resist pattern 80 having one or more openings 100 (e.g., holes) is formed over second ILD layer 70 by using a lithography operation. In some embodiments, a bottom antireflective coating (BARC) layer is formed between the photo resist layer and the second ILD layer and the layer 80 is a combination of the photo resist layer and the BARC layer or the BARC layer (the photo resist layer is removed). Hereinafter, the layer 80 is referred to as a mask layer 80.

The holes 100 are designed to align the gate electrodes 40 and thus in an ideal case, the holes 100 are formed just above the center of the gate electrodes 40, respectively. However, in an actual manufacturing operation, an overlay error OL between the underlying pattern (gate electrodes 40) and the formed pattern (mask layer 80) may exist. In FIG. 4A, the holes are shifted in location by the amount OL in the +X direction. In some embodiments, the overlay error OL is more than zero and less than about 1-10 nm (e.g., 1, 2, 3, 5 or 8 nm).

Next, as shown in FIGS. 5A and 5B, a shifting film 90 is formed in and over the holes 100. In some embodiments, the shifting film 90 includes a material different from the second ILD layer 70 and the gate cap dielectric layer 48. In some embodiments, the shifting film 90 includes an organic polymer material or a silicone polymer. In other embodiments, the shifting film 90 includes a dielectric material, such as silicon oxide, silicon nitride, SiON, SiOC, SiOCN, SiCN, aluminum based dielectric material (AlO, AlOC, AlN), titanium oxide, low-k material, or any other dielectric material used in a semiconductor device fabrication. In some embodiments, the shifting film 90 is a $CF_x$ or $CF_xH_y$ or their polymer formed by plasma CVD using a carbon source gas ($CF_4$, $CFH_3$, $CF_2H_2$ and/or $CF_3H$). In certain embodiments, the shifting film 90 is a $Si_xO_y$ polymer formed by plasma CVD using a mixed gas of a silicon source gas ($SiCl_4$, $SiHCl_3$, $SiH_2Cl_2$ and/or $SiH_3Cl$), $O_2$ and Ar. In other embodiments, the shifting film 90 includes a conductive material, such as polysilicon, amorphous silicon, Ti, TiN, Ta, TaN or any other material used in a semiconductor device fabrication. The shifting film 90 can be formed by chemical vapor deposition (CVD), or atomic layer deposition (ALD), although any acceptable process may be utilized.

In some embodiments, a thickness of the shifting film 90 is in a range from about 0.5 nm to about 5 nm and is in a range from about 1 nm to 3 nm in other embodiments, depending on the overlay error OL. In some embodiments, the thickness of the shifting film 90 is equal to or smaller than the overlay error OL After the shifting film 90 is conformally formed, anisotropic etching (e.g., plasma dry etching) is performed to remove the shifting film 90 deposited on the upper surface of the mask layer 80 and at the bottom of the holes 100, as shown in FIGS. 6A and 6B.

Then, one or more one-directional etching operations 150 are performed to remove the shifting film 90 at the left side and a part of the mask layer 80, as shown in FIGS. 7A and 7B. The etching amount of the part of the mask layer 80 is substantially the same as the thickness of the shifting film 90 in the holes 100 (the difference is within about ±10% of the initial thickness of the shifting film 90). Accordingly, after the one-directional etching, the size (diameter) of the holes 100 is substantially the same as that before the shifting film 90 is formed (FIGS. 4A and 4B). In some embodiments, the difference in the diameter is within about ±10% of the initial diameter.

After one cycle of the shifting film formation and the one-directional etching, the holes 100 are moved to –X direction by the amount of the thickness of the shifting film 90, or the average of the thickness of the shifting film 90 and the etched amount of the mask layer 80. If the shifted amount is the same as the overlay error OL or the remaining overlay error is equal to or smaller than a threshold (e.g., 0.1, 0.15 or 0.2 nm), the operation proceeds to the etching of the underlying layers (see, FIGS. 9A and 9B). In some embodiments, the upper portion of the mask layer 80 is also etched and thus the thickness of the mask layer 80 is reduced.

In some embodiments, the one-directional etching utilizes plasma using oxygen gas and a fluorocarbon gas, such as, $CH_3F$, $CH_2F_2$, $CHF_3$, and/or $CF_4$ with or without $CH_4$, or etc.

If the shifted amount is smaller than the overlay error OL or the remaining overlay error is greater than the threshold, one or more one cycles of the shifting film formation and the one-directional etching are additionally performed, until the remaining overlay error is equal to or smaller than the threshold. FIGS. 8A and 8B shows an embodiment after an additional shifting film 95 is formed.

After the remaining overlay error is equal to or smaller than the threshold, etching of the underlying layers, the second ILD layer 70 and the gate cap dielectric layer 48, is performed, to expose the upper face of the gate electrode 40 as shown in FIGS. 9A and 9B.

After the etching, the mask layer 80 and the shifting films 90 and 95 are removed, and holes 105 are formed as shown in FIGS. 10A and 10B. Subsequently, the holes 105 are filled with one or more conductive material, thereby forming gate contact 110, as shown in FIGS. 11A and 11B. In some embodiments, the gate contact 110 includes one or more layers of layers of W, Ni, Co, Mo, Ti, or alloy thereof.

In the foregoing embodiments, a sequential process for forming a contact hole to a gate electrode are explained. In other embodiments, a contact hole is formed on a source/drain structure or any underlying conductive pattern by using the same or similar technique as set froth above.

FIG. 12 shows a flow chart of a sequential manufacturing operation of a semiconductor device in accordance with an embodiment of the present disclosure. At S101, a photo resist pattern is formed over the underlying layer to be patterned. At S102, an overlay error is measured. At S103, a thickness of a shifting film is determined based on the overlay error. In some embodiments, a number of shifting film deposition and one-directional etching operations is also determined. At S104, a shifting film is formed, and at S105, a one-directional etching operation is performed to shift the pattern in the photo resist layer. If the shifted amount is insufficient, S104 and S105 are repeated. At S106, when the patterns are shifted to a desired location, an etching operation is performed to pattern the underlying layer. At S107, the photo resist layer and the shifting film are removed.

In the foregoing embodiments, the case where an overlay error in only the X direction is explained. However, the overlay error are generally measured in the X direction and the Y direction (see, FIG. 13B). In some embodiments, one or more cycles of the shifting film formation and the one-directional etching are performed to shift the pattern in the X direction (or Y direction), and one or more cycles of the shifting film formation and the one-directional etching are performed to shift the pattern in the Y direction (or X direction).

Figure 13A:
FIG. 13A shows a flow chart of a sequential manufacturing operation of a semiconductor device and FIG. 13B illustrates overlay errors and an angle of wafer rotation in accordance with an embodiment of the present disclosure.

FIG. 13A shows a flow chart of a sequential manufacturing operation of a semiconductor device in accordance with an embodiment of the present disclosure. It is understood that additional operations can be provided before, during, and after processes shown by FIG. 13A, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 2A-12 may be employed in the following embodiments, and some of the explanations may be omitted.

Figure 13B:
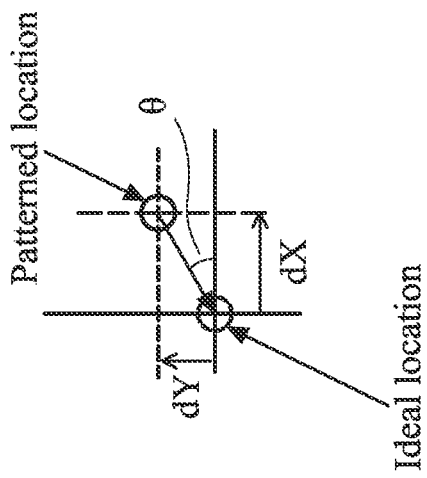

In this embodiment, when the overlay error include an X-direction error and a Y direction error as shown in FIG. 13B, the pattern is shifted in an oblique direction to the desired location. The operations of S201, S202, S204, S206 and S207 are the same as the operations of S101, S102, S104, S106 and S107 of FIG. 12.

As shown in FIG. 13B, the overlay error is measured as (dX, dY) from the ideal or designed location. At S203, an angle θ is calculated, i.e., $\theta=\tan^{-1}(dY/dX)$ in addition to the shifting film thickness. At S205, a wafer is relatively rotated with respect to the direction of ion species of the one-directional etching such that the direction of the one-directional etching coincide the line connecting the location of the actual pattern and the ideal location. For example, the direction of the ion species is in the –X direction and dX and dY are both positive value as shown in FIG. 13B, the wafer is rotated by an angle of –θ. It is noted that the X direction in the wafer is generally coincident with a gate extending direction or a channel (fin) extending direction (source-to-drain direction). Then, in S206, the one-directional etching is performed to shift the pattern toward the ideal location.

Figure 15:
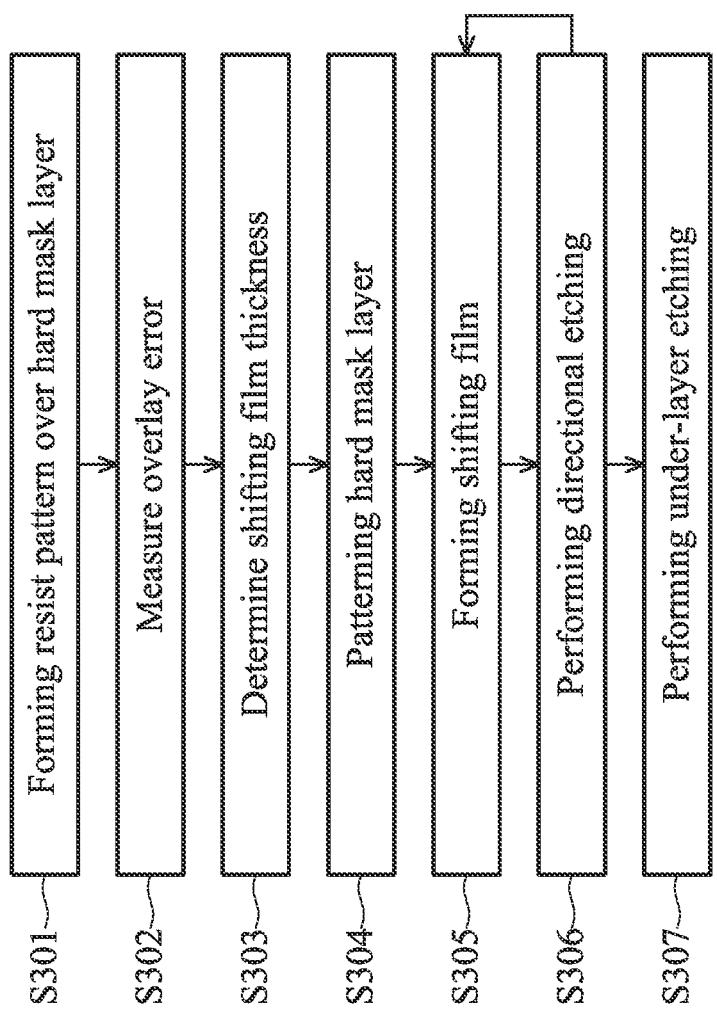
FIG. 15 shows a flow chart of a sequential manufacturing operation of a semiconductor device in accordance with an embodiment of the present disclosure.

FIGS. 14A-14F illustrate cross sectional views of the various stages of a sequential manufacturing operation and FIG. 15 shows a flow chart of the sequential manufacturing operation of a semiconductor device in accordance with an embodiment of the present disclosure. It is understood that additional operations can be provided before, during, and after processes shown by FIGS. 14A-14F and FIG. 15, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 2A-13B may be employed in the following embodiments, and some of the explanations may be omitted.

In the foregoing embodiments, a photo resist pattern (and/or a BARC pattern) is shifted. In this embodiment, a hard mask pattern is shifted by a shifting film formation and a one-directional etching. As shown in FIG. 14A, a photo resist pattern 88 is formed over a hard mask layer 85, and as shown in FIG. 14B, a hard mask pattern 85 having openings (e.g., holes) 102 is formed over the second ILD layer 70 by one or more patterning operations. In some embodiments, the hard mask layer 85 is made of a different material than the second ILD layer 70 and the gate gap dielectric layer 48, which are to be etched. The hard mask layer 85 includes one or more layers of dielectric material, such as, silicon oxide, silicon nitride, SiON, SiOC, SiOCN, SiCN, titanium oxide, aluminum based dielectric material, low-k material, organic material, or any other dielectric material used in a semiconductor device fabrication, or conductive material, such as, polysilicon, amorphous silicon, TiN, TaN, or any other conductive material used in a semiconductor device fabrication.

The hard mask pattern 85 is formed by using one or more lithography and etching operation. After the lithography operation, an overlay error is measured.

Then, a shifting film 92 is formed as shown in FIG. 14C. In some embodiments, the shifting film 92 is made of the same material as the hard mask layer 85. In other embodiments, the shifting film 92 is made of a different material than the hard mask layer 85, the second ILD layer 70 and the cap insulating layer 48. The shifting film 92 is formed by CVD or ALD in some embodiments.

Next, as shown in FIG. 14D, anisotropic etching is performed on the shifting film 92 and the shifting film covering the bottom of the opening 102 is removed.

Subsequently, one or more directional etching operations 152 are performed in the X direction to remove the shifting film on the left side of the opening 102 and a part of the hard mask layer 85. If the shifted amount is insufficient, the shifting film formation and the one-directional etching are repeated. If the opening patterns 102 are shifted to a desired location, etching of the second ILD layer 70 and the gate cap dielectric layer 48 is performed as shown in FIG. 14F. Subsequently, one or more conductive materials are formed in openings (holes) 107 in some embodiments. In other embodiments, before the conductive material is formed, the hard mask layer 85 and the shifting film 92 are removed.

FIG. 15 shows a flow chart of the sequential manufacturing operation of a semiconductor device corresponding to the embodiment of FIGS. 14B-14F. The operations of S301, S302 and S303 are the same as the operations of S101, S102 and S103 of FIG. 12. In S304, the hard mask layer is patterned by using the photo resist pattern as an etching mask, and then the photo resist pattern is removed. At S305, a shifting film is formed, and at S306, a one-directional etching operation is performed to shift the pattern in the hard mask layer. If the shifted amount is insufficient, S305 and S306 are repeated. At S307, when the patterns are shifted to a desired location, an etching operation is performed to pattern the underlying layer.

In the foregoing embodiments, opening patterns, such as holes, are formed in a photo resist layer or a hard mask layer. The patterns are not limited to holes, and include trenches, elongated spaces, openings with the same or different sizes, and any other patterns defining areas of the underlying layer to be etched.

Further, the patterns to be shifted are island patterns, such as line patterns, island patterns, dots, or any other patterns defining areas of the underlying layer to be protected.

FIGS. 16A, 16B, 16C, 16D and 16E illustrate cross sectional views of the various stages of a sequential manufacturing operation of a semiconductor device in accordance with an embodiment of the present disclosure. It is understood that additional operations can be provided before, during, and after processes shown by FIGS. 16A-16E, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 2A-15 may be employed in the following embodiments, and some of the explanations may be omitted.

Figure 16C:
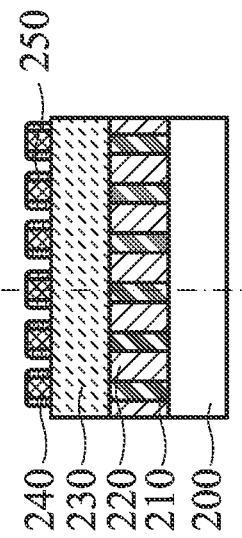
FIGS. 16A, 16B, 16C, 16D and 16E illustrate cross sectional views of the various stages of manufacturing operations in accordance with an embodiment of the present disclosure.
Figure 16B:
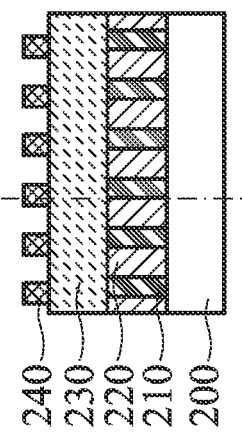
Figure 16E:
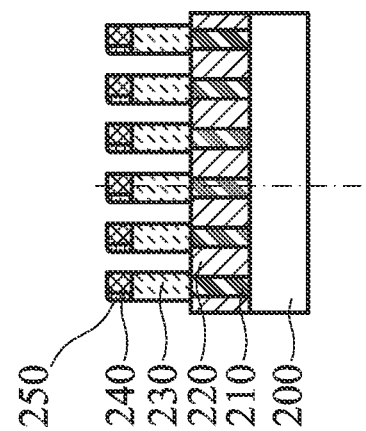
Figure 16A:
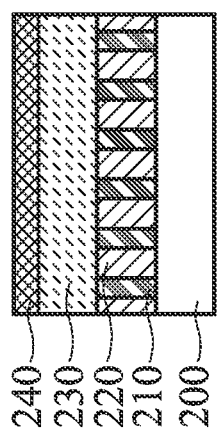
Figure 16D:
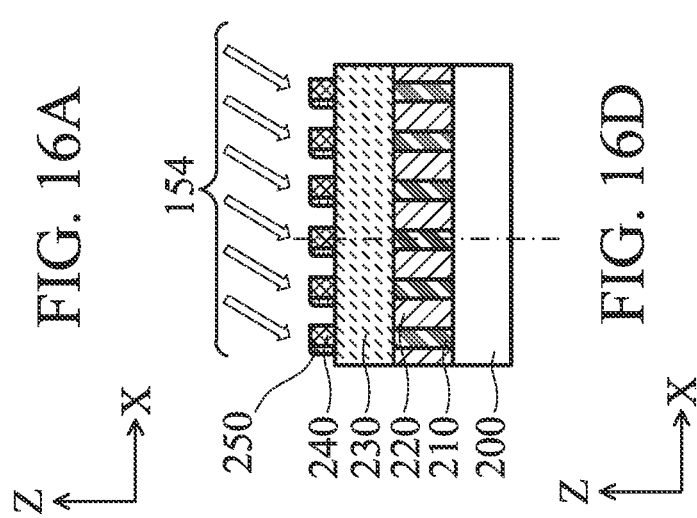

As shown in FIG. 16A, underlying conductive patterns 210 are formed on a lower layer 200 and embedded in an ILD layer 220 in some embodiments. In some embodiments, the underlying conductive patterns 210 are via holes or contact holes. The lower layer 200 is an insulating layer in which one or more conductive patterns coupling to the underlying conductive patterns 210 are embedded. Further, a conductive layer 230 is formed over the underlying conductive patterns 210 and the ILD layer 220. The conductive layer 230 includes one or more layers of silicon, SiGe, W, Cu, Ti, Ag, Al, TiAl, TiAlN, TaC, TaCN, TaSiN, Mn, Co, Pd, Ni, Re, Ir, Ru, Pt, and Zr. Further, a hard mask layer 240 is formed over the conductive layer 230. The hard mask layer 240 includes one or more layers of dielectric material, such as, silicon oxide, silicon nitride, SiON, SiOC, SiOCN, SiCN, titanium oxide, aluminum based dielectric material, low-k material, organic material, or any other dielectric material used in a semiconductor device fabrication.

Then, the hard mask layer 240 is patterned pattern by using one or more lithography and etching operation as shown in FIG. 16B. In some embodiments, the hard mask pattern 240 includes a plurality of line patterns. After the lithography operation, an overlay error is measured. As shown in FIG. 16B, the line patterns are shifted to the +X direction with respect to the underlying patterns 210 to be aligned.

Then, a shifting film 250 is formed, and anisotropic etching is performed, as shown in FIG. 16C. In some embodiments, the shifting film 250 is made of the same material as the hard mask layer 240. In other embodiments, the shifting film 250 is made of a different material than the hard mask layer 240. The shifting film 250 is formed by CVD or ALD in some embodiments. In some embodiments, after the anisotropic etching, the shifting film forms sidewalls, as shown in FIG. 16C Subsequently, one or more directional etching operations 154 are performed in the X direction to remove the shifting film 250 on the right side of the line patterns of the hard mask layer 240 and a part of the hard mask layer 240. If the shifted amount is insufficient, the shifting film formation and the one-directional etching are repeated. If the line patterns 240 are shifted to a desired location, etching of the conductive layer 230 is performed as shown in FIG. 16E. As shown in FIG. 16E, the etched line patterns of the conductive layer are substantially aligned to the underlying conductive patterns 210. Subsequently, in some embodiments, the hard mask layer 240 and the shifting film 250 are removed.

FIGS. 17A, 17B, 17C, 17D and 17E illustrate cross sectional views of the various stages of a sequential manufacturing operation of a semiconductor device in accordance with an embodiment of the present disclosure. It is understood that additional operations can be provided before, during, and after processes shown by FIGS. 17A-17E, and some of the operations described below can be replaced or eliminated, for additional embodiments of the method. The order of the operations/processes may be interchangeable.

Materials, configurations, dimensions, structures, conditions and operations the same as or similar to those explained with respect to FIGS. 2A-16E may be employed in the following embodiments, and some of the explanations may be omitted.

Figure 17A:
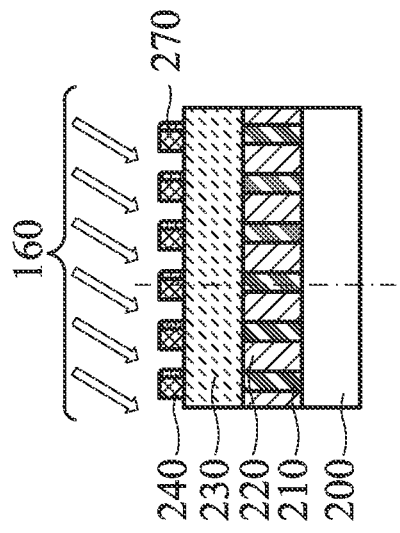
FIGS. 17A, 17B, 17C, 17D and 17E illustrate cross sectional views of the various stages of manufacturing operations in accordance with an embodiment of the present disclosure.
Figure 17B:
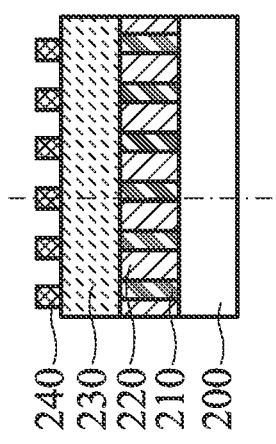

The directional etching operation can be converted to a directional deposition operation by changing a plasma source gas and plasma conditions. FIG. 17A is the same as FIG. 16A. As shown in FIG. 17B, the hard mask layer 240 is patterned by using one or more lithography and etching operations. In some embodiments, the hard mask pattern 240 includes a plurality of line patterns. After the lithography operation, an overlay error is measured. As shown in FIG. 17B, the line patterns are shifted to the −X direction with respect to the underlying patterns 210 to be aligned.

After the line patterns are formed in the hard mask layer 240, a shifting film 270 is formed by one or more one-directional deposition operations 160 on the right sidewalls of the line patterns 240. Similar to a one-directional etching operation, by tuning various deposition parameters to generate depositing species (radicals, molecules, atoms, etc.) that travel in a substantially horizontal direction or incident on the substrate with a large incident angle of more than about 70 degrees (where the angle of 90 degrees is horizontal). The deposition parameters to be tuned include, but are not limited to, deposition gas composition, deposition temperature, deposition time, deposition pressure, radio frequency (RF) bias voltage, RF bias power, gas flow rate, wafer tilting, other suitable parameters, or combinations thereof.

Figure 17C:
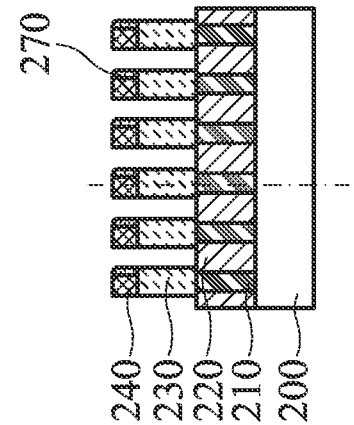

As shown in FIG. 17C, the directional deposition operations are performed in the −X direction. An amount of a deposited shifting film 270 in the X direction is greater than an amount of a deposited shifting film in the Y direction. In some embodiments, the amount of the deposited shifting film in the X direction is twice or more, five times or more, or ten times or more (up to 100 times) the amount of the deposited shifting film in the Y direction. In some embodiments, the thickness of the shifting film on the sidewalls of the line patterns is in a range from about 0.5 nm to about 5 nm and is in a range from about 1 nm to 3 nm in other embodiments, depending on the overlay error. In some embodiments, after the shifting film 270 is formed, anisotropic etching is performed to remove excess shifting film formed in the spaces.

Figure 17D:
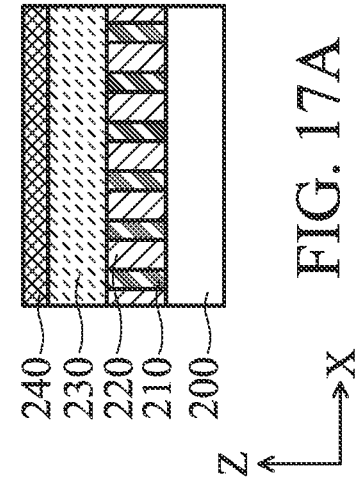
Figure 17E:
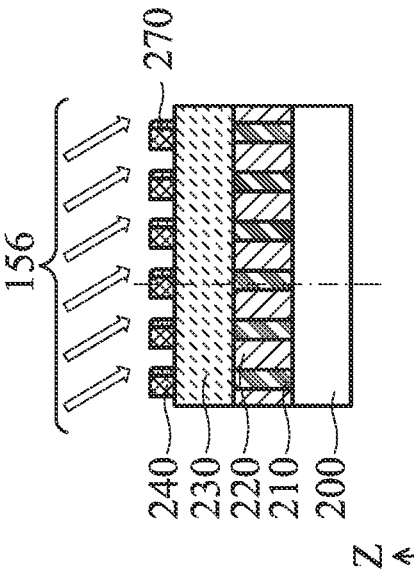

Then, as shown in FIG. 17D, one or more directional etching operations 156 is performed in the +X direction to remove the left side of the line patterns of the hard mask layer 240. If the shifted amount is insufficient, the shifting film formation and the one-directional etching are repeated. If the line patterns 240 are shifted to a desired location, etching of the conductive layer 230 is performed as shown in FIG. 17E. As shown in FIG. 17E, the etched line patterns of the conductive layer are substantially aligned to the underlying conductive patterns 210. Subsequently, in some embodiments, the hard mask layer 240 and the shifting film 270 are removed.

As set forth above, by using a shifting film deposition and a one-directional etching operation, it is possible to compensate an overlay error caused by the lithography operation, and thus obtain higher yield in device manufacturing. Further, it is not necessary to rework the lithography operation, which is a much expensive process step than other process steps.

It will be understood that not all advantages have been necessarily discussed herein, no particular advantage is required for all embodiments or examples, and other embodiments or examples may offer different advantages.

In accordance with an aspect of the present disclosure, in a method of forming a pattern over a semiconductor substrate, a target layer to be patterned is formed over the semiconductor substrate, a mask pattern including an opening is formed in a mask layer over the target layer, a shifting film is formed in an inner sidewall of the opening, a one-directional etching operation is performed to remove a part of the shifting film and a part of the mask layer to form a shifted opening, and the target layer is patterned by using the mask layer with the shifted opening as an etching mask. A location of the shifted opening is laterally shifted from an original location of the opening. In one or more of the foregoing and following embodiments, the mask layer is a photo resist layer. In one or more of the foregoing and following embodiments, the shifting film includes an organic material. In one or more of the foregoing and following embodiments, the organic material includes a polymer of carbon and fluorine or a polymer of carbon, fluorine and hydrogen. In one or more of the foregoing and following embodiments, a thickness of the shifting film on the inner sidewall of the opening is in a range from 1 nm to 3 nm. In one or more of the foregoing and following embodiments, in the one-directional etching, an etching rate of the shifting film in a first direction is greater than an etching rate of the shifting film in a second direction opposite to the first direction, the first and second directions being parallel to a principal surface of the semiconductor substrate. In one or more of the foregoing and following embodiments, the etching rate of the shifting film in the first direction is five times or more the etching rate of the shifting film in the second direction. In one or more of the foregoing and following embodiments, in the one-directional etching, an etching rate of the shifting film in the first direction is greater than an etching rate of the shifting film in a third direction and a fourth direction opposite to the third direction, the third and fourth directions being perpendicular to the first and second directions and parallel to the principal surface of the semiconductor substrate. In one or more of the foregoing and following embodiments, the etching rate of the shifting film in the first direction is ten times or more the etching rate of the shifting film in the third and fourth directions. In one or more of the foregoing and following embodiments, the opening has a circular shape in plan view.

In accordance with another aspect of the present disclosure, in a method of manufacturing a semiconductor device, an underlying pattern is formed over a semiconductor substrate, a target layer to be patterned is formed over the underlying pattern, a photo resist layer including a pattern is formed over the target layer, an overlay error between the photo resist pattern and the underlying pattern is measured, and the photo resist pattern is shifted by one or more cycles of depositing a shifting film and performing a one-directional etching operation such that a residual overlay error between the shifted photo resist pattern and the underlying pattern becomes equal to or less than a threshold value. In one or more of the foregoing and following embodiments, the pattern includes a hole pattern. In one or more of the foregoing and following embodiments, in the forming the shifting film, a layer for the shifting film is conformally formed in the hole pattern and on an upper surface of the photo resist layer, and an anisotropic etching is performed on the layer for the shifting film thereby leaving the shifting film on an inner sidewall of the hole pattern. In one or more of the foregoing and following embodiments, at least one of a thickness of the shifting film or a number of the one or more cycles is determined based on the measured overlay error. In one or more of the foregoing and following embodiments, the shifting film includes a polymer of carbon and fluorine or a polymer of carbon, fluorine and hydrogen. In one or more of the foregoing and following embodiments, the etching rate of the underlying layer along the first axis is five to twenty times the etching rate of the underlying layer along the second axis perpendicular to the first axis. In one or more of the foregoing and following embodiments, the first and second openings have a rounded-cornered rectangular shape extending in the first direction in plan view. In one or more of the foregoing and following embodiments, each of the first and second openings has a circular shape in plan view.

In accordance with another aspect of the present disclosure, in a method of manufacturing a semiconductor device, an underlying pattern is formed over a semiconductor substrate, a target layer to be patterned is formed over the underlying pattern, a hard mask layer is formed over the target layer, a photo resist layer including a pattern is formed over the hard mask layer, an overlay error between the photo resist pattern and the underlying pattern is measured, a hard mask pattern is formed in the hard mask layer by patterning the hard mask layer using the photo resist layer as an etching mask, the hard mask pattern is shifted by one or more cycles of depositing a shifting film and performing a one-directional etching operation, and the target layer is patterned using the shifted hard mask pattern as an etching mask. In one or more of the foregoing and following embodiments, the shifting film and the hard mask layer are made of dielectric materials. In one or more of the foregoing and following embodiments, the shifting film and the hard mask layer are made of a same material. In one or more of the foregoing and following embodiments, the shifting film and the hard mask layer are made of different materials from each other. In one or more of the foregoing and following embodiments, the pattern is an opening having a circular shape in plan view.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a pattern over a semiconductor substrate in a main chamber, the method comprising:
    forming a target layer to be patterned over the semiconductor substrate;
    forming a mask pattern including an opening in a mask layer over the target layer using a radiation generated from a plasma generation chamber;
    performing a one-directional deposition operation to form a shifting film on a part of an inner sidewall of the opening,
    performing a one-directional etching operation to remove a part of the shifting film and a part of the mask layer to form a shifted opening; and
    patterning the target layer by using the mask layer with the shifted opening as an etching mask,
    wherein a separation plate including a slit is disposed between the plasma generation chamber and the main chamber, wherein a meniscus disposed over the slit in the plasma generation chamber, wherein the meniscus is adjusted relative to the slit of the separation plate to control an etching direction of the one-directional etching operation, and wherein a location of the shifted opening is laterally shifted from an original location of the opening.

2. The method of claim 1, wherein the mask layer is a photo resist layer.

3. The method of claim 2, wherein the shifting film includes an organic material.

4. The method of claim 3, wherein the organic material includes a polymer of carbon and fluorine or a polymer of carbon, fluorine and hydrogen.

5. The method of claim 1, wherein a thickness of the shifting film on the inner sidewall of the opening is in a range from 1 nm to 3 nm.

6. The method of claim 1, wherein in the one-directional etching, an etching rate of the shifting film in a first direction is greater than an etching rate of the shifting film in a second direction opposite to the first direction, the first and second directions being parallel to a principal surface of the semiconductor substrate.

7. The method of claim 6, wherein the etching rate of the shifting film in the first direction is five times or more the etching rate of the shifting film in the second direction.

8. The method of claim 6, wherein in the one-directional etching, an etching rate of the shifting film in the first direction is greater than an etching rate of the shifting film in a third direction and a fourth direction opposite to the third direction, the third and fourth directions being perpendicular to the first and second directions and parallel to the principal surface of the semiconductor substrate.

9. The method of claim 8, wherein the etching rate of the shifting film in the first direction is ten times or more the etching rate of the shifting film in the third and fourth directions.

10. The method of claim 1, wherein the opening has a circular shape in plan view.

11. A method of manufacturing a semiconductor device in a main chamber, the method comprising:
    forming an underlying pattern over a semiconductor substrate using a radiation generated from a plasma generation chamber;
    forming a target layer to be patterned over the underlying pattern;
    forming a photo resist layer including a photo resist pattern over the target layer;
    measuring an overlay error between the photo resist pattern and the underlying pattern; and
    shifting the photo resist pattern by one or more cycles of performing a one-directional deposition operation of a shifting film and performing a one-directional etching operation such that a residual overlay error between the shifted photo resist pattern and the underlying pattern becomes equal to or less than a threshold value,
    wherein a separation plate including a slit is disposed between the plasma generation chamber and the main chamber, wherein a meniscus disposed over the slit in the plasma generation chamber, and wherein the meniscus is adjusted relative to the slit of the separation plate to control an etching direction of the one-directional etching operation.

12. The method of claim 11, wherein the photo resist pattern includes a hole photo resist pattern.

13. The method of claim 12, wherein the forming the shifting film includes:

conformally forming a layer for the shifting film in the hole photo resist pattern and on an upper surface of the photo resist layer; and performing an anisotropic etching on the layer for the shifting film thereby leaving the shifting film on an inner sidewall of the hole photo resist pattern.

14. The method of claim 11, further comprising determining at least one of a thickness of the shifting film or a number of the one or more cycles based on the measured overlay error.

15. The method of claim 11, wherein the shifting film includes a polymer of carbon and fluorine or a polymer of carbon, fluorine and hydrogen.

16. A method of manufacturing a semiconductor device in a main chamber, the method comprising:

forming an underlying pattern over a semiconductor substrate using a radiation generated from a plasma generation chamber;

forming a target layer to be patterned over the underlying pattern;

forming a hard mask layer over the target layer;

forming a photo resist layer including a photo resist pattern over the hard mask layer;

measuring an overlay error between the photo resist pattern and the underlying pattern;

forming a hard mask pattern in the hard mask layer by patterning the hard mask layer using the photo resist layer as an etching mask;

shifting the hard mask pattern by one or more cycles of performing a one-directional deposition operation of a shifting film and performing a one-directional etching operation; and patterning the target layer using the shifted hard mask pattern as an etching mask, wherein a separation plate including a slit is disposed between the plasma generation chamber and the main chamber, wherein a meniscus disposed over the slit in the plasma generation chamber, and wherein the meniscus is adjusted relative to the slit of the separation plate to control an etching direction of the one-directional etching operation.

17. The method of claim 16, wherein the shifting film and the hard mask layer are made of dielectric materials.

18. The method of claim 17, wherein the shifting film and the hard mask layer are made of a same material.

19. The method of claim 17, wherein the shifting film and the hard mask layer are made of different materials from each other.

20. The method of claim 17, wherein the photo resist pattern includes an opening having a circular shape in plan view.

* * * * *